(12) United States Patent
Dodd et al.

(10) Patent No.: US 10,264,667 B2
(45) Date of Patent: Apr. 16, 2019

(54) MICROFLUIDIC DELIVERY SYSTEM WITH A DIE ON A RIGID SUBSTRATE

(71) Applicants: STMicroelectronics, Inc., Coppell, TX (US); STMicroelectronics S.R.L., Agrate Brianza (IT); STMicroelectronics International N.V., Schiphol (NL)

(72) Inventors: Simon Dodd, West Linn, OR (US); Joe Scheffelin, Poway, CA (US); Dave Hunt, San Diego, CA (US); Steve Bush, Liberty Township, OH (US); Faiz Sherman, Mason, OH (US)

(73) Assignees: STMicroelectronics, Inc., Coppell, TX (US); STMicroelectronics S.R.L., Agrate Brianza (IT); STMicroelectronics International N.V., Schiphol (NL)

( * ) Notice: Subject to any disclaimer, the term of this patent is extended or adjusted under 35 U.S.C. 154(b) by 289 days.

(21) Appl. No.: 14/310,601

(22) Filed: Jun. 20, 2014

(65) Prior Publication Data
US 2015/0373840 A1 Dec. 24, 2015

(51) Int. Cl.
*H05K 1/02* (2006.01)
*B41J 2/175* (2006.01)

(52) U.S. Cl.
CPC .......... *H05K 1/0272* (2013.01); *B41J 2/1753* (2013.01); *B41J 2/17506* (2013.01); *B41J 2/17513* (2013.01); *H05K 1/0212* (2013.01); *Y10T 137/6416* (2015.04)

(58) Field of Classification Search
CPC ..... H05K 1/0272; H05K 1/0212; B41J 2/175; B41J 2/17506; B41J 2/17513; B41J 2/1753; Y10T 137/6416

USPC ........................................................... 239/82
See application file for complete search history.

(56) References Cited

U.S. PATENT DOCUMENTS

| 6,084,618 A | 7/2000 | Baker |
| 6,548,895 B1 | 4/2003 | Benavides et al. |
| 7,004,198 B1 | 2/2006 | Okandan et al. |
| 7,422,911 B2 | 9/2008 | Schembri |

(Continued)

FOREIGN PATENT DOCUMENTS

| CN | 101341028 A | 1/2009 |
| CN | 103240986 A | 8/2013 |
| CN | 204820669 U | 12/2015 |

OTHER PUBLICATIONS

U.S. Appl. No. 15/138,977, filed Apr. 26, 2016, Microfluidic Delivery Member With Filter and Method of Formaing Same.

(Continued)

*Primary Examiner* — Chee-Chong Lee
(74) *Attorney, Agent, or Firm* — Seed IP Law Group LLP

(57) ABSTRACT

The present disclosure is directed to a system that is configured to eject fluid vertically away from a thermal microfluidic die for use with scented oils or other fluids. The die is coupled to a rigid planar support board that separates the die from a reservoir of the fluid. The support board includes an opening that is lined with an inert liner that protects an interior surface of the support board from the fluid. The support board includes contact to an external power supply and contacts to the die on a first surface. The die is coupled to this first surface such that the second surface remains free of electrical connections.

10 Claims, 18 Drawing Sheets

(56) References Cited

U.S. PATENT DOCUMENTS

| | | | |
|---|---|---|---|
| 7,784,914 B2 | 8/2010 | Dodd et al. | |
| 8,899,727 B2 * | 12/2014 | Owaki | B41J 2/125 347/19 |
| 2002/0005878 A1 | 1/2002 | Moon et al. | |
| 2007/0126773 A1 * | 6/2007 | Anderson | B41J 2/14129 347/20 |
| 2007/0139475 A1 * | 6/2007 | King | B41J 2/04541 347/50 |
| 2008/0309730 A1 | 12/2008 | Sato et al. | |
| 2008/0316274 A1 * | 12/2008 | Kondo | B41J 2/14201 347/50 |
| 2009/0212407 A1 * | 8/2009 | Foster | B81B 7/0006 257/686 |
| 2011/0122194 A1 * | 5/2011 | Anderson | B41J 2/14145 347/44 |
| 2011/0292124 A1 * | 12/2011 | Anderson | B41J 2/14072 347/44 |
| 2012/0293584 A1 * | 11/2012 | Fang | B41J 2/1404 347/44 |

OTHER PUBLICATIONS

Chinese Search Report, dated Jul. 24, 2016, for Chinese Application No. 2015103010512, 2 pages.

* cited by examiner

MICROFLUIDIC DELIVERY SYSTEM WITH A DIE ON A RIGID SUBSTRATE

BACKGROUND

Technical Field

The present disclosure is directed to a microfluidic delivery system including a rigid substrate that supports a die and is configured to provide a fluid path to the die.

Description of the Related Art

Thermal inkjet technology is typically utilized in printers for ejection of drops of ink onto paper. The inkjet technology includes replaceable inkjet cartridges that include an ink reservoir that provides the ink to a MEMS die or print head that is spaced from the reservoir. The print head is positioned on an extended end of the cartridge that is separated from a main body that holds the reservoir. When installed in the printer, the printed head is the lowest point of the cartridge, closest to the paper. In the printer, gravity moves the ink from the reservoir to the print head.

The print head is spaced from electrical contact pads that couple the cartridge to the printer such that the print head is on a different plane than the electrical contact pads. The contact pads are often at an opposite end of the cartridge from the print head. The cartridges include a flexible electrical connection that couples the contact pads to the print head. This allows the end that holds the print head to be a small as possible and include as few features as possible. The flexible electrical connections conform to the sides of the cartridge until they couple to the external contact pads that provide external power to the cartridge. The print head and the contact pads for the external power supply are on different planes, which is very expensive to implement.

BRIEF SUMMARY

The present disclosure is directed to a fluid delivery system that is configured to eject fluid vertically away from a thermal microfluidic die for use with scented oils or other fluids. The system includes a reservoir that is in fluid communication with a rigid planar support and the die. The die is coupled to the rigid planar support in a way that allows nozzles of the die to eject the fluid vertically away from the system. In addition, the system is configured to vaporize the fluid sufficiently that little or no fluid drips back down onto the die. This prevents the nozzles from being plugged by the fluid as it dries.

The support includes an opening that is lined with an inert liner that protects an interior surface of the support from the fluid. The inert liner can be used to line all exposed surfaces along the fluid path. Alternatively, the inert liner can line only the sidewalls of the support, depending on the application and the fluid to be ejected.

The support includes first contacts to an external power supply and second contacts to the die on a first surface. The die is coupled to this first surface such that the second surface remains free of electrical connections. The die and first and second contacts are formed in a same plane that allows for easy and cost effective manufacturing while providing reliable support for the vertical ejection of the fluid.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
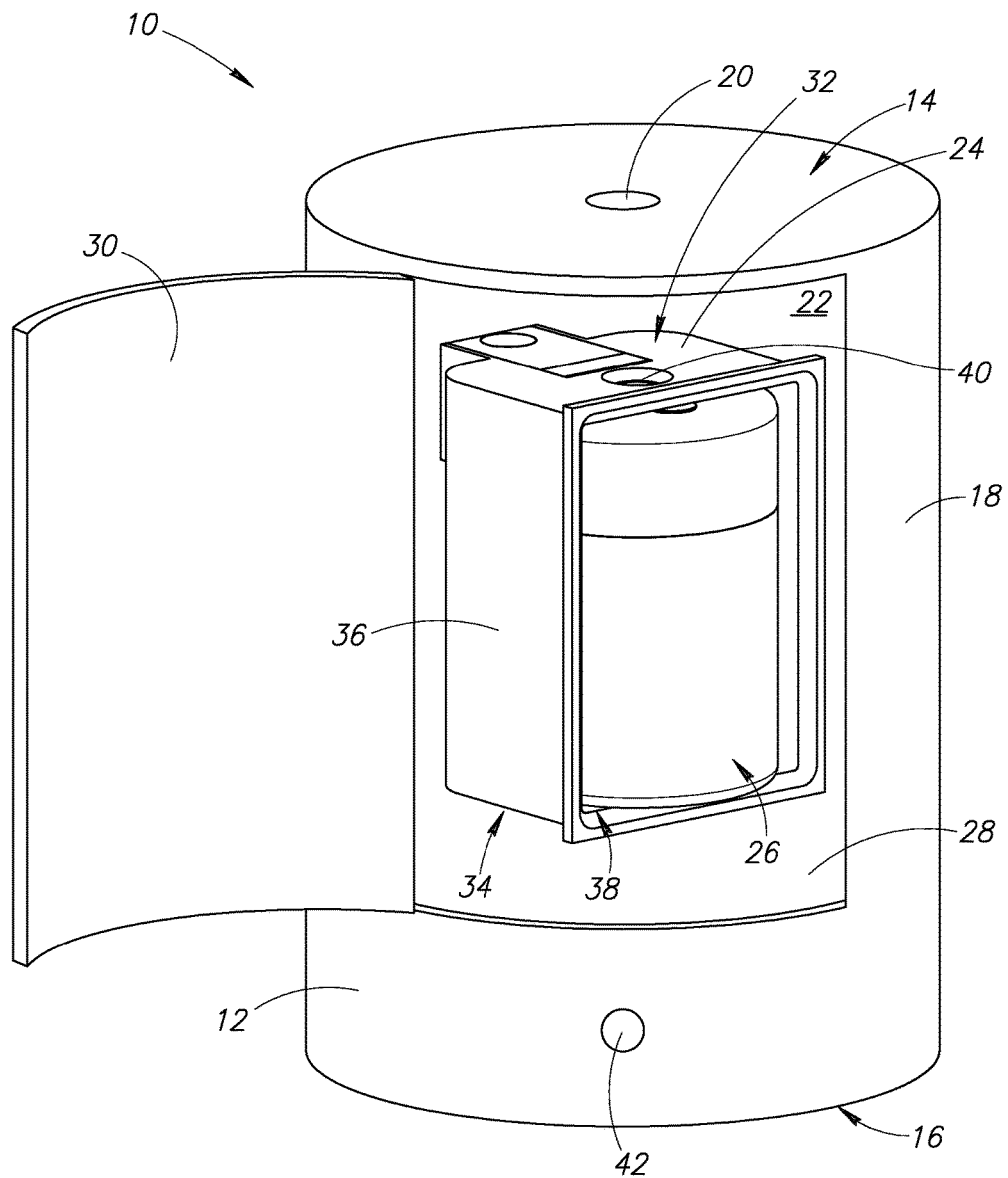
FIG. 1 is a schematic isometric view of a microfluidic delivery system in accordance with one embodiment.

FIG. 1 illustrates a microfluidic delivery system 10 formed in accordance with one embodiment of the disclosure. The microfluidic delivery system 10 includes a housing 12 having an upper surface 14, a lower surface 16, and a body portion 18 between the upper and lower surfaces. The upper surface of the housing 12 includes a first hole 20 that places an environment external to the housing 12 in fluid communication with an interior portion 22 of the housing 12. The interior portion 22 of the housing 12 includes a holder member 24 that holds a removable microfluidic refill cartridge 26. As will be explained below, the microfluidic delivery system 10 is configured to use thermal energy to deliver fluid from within the microfluidic refill cartridge 26 to an environment external to the housing 12.

Access to the interior portion 22 of the housing is provided by an opening 28 in the body portion 18 of the housing 12. The opening 28 is accessible by a cover or door 30 of the housing 12. In the illustrated embodiment, the door 30 rotates to provide access to the opening 28.

The holder member 24 includes an upper surface 32 and a lower surface 34 that are coupled together by one or more sidewalls 36 and has an open side 38 through which the microfluidic refill cartridge 26 can slide in and out. The upper surface 32 of the holder member 24 includes an opening 40 that is aligned with the first hole 20 of the housing 12. The holder member 24 holds the microfluidic refill cartridge 26 in position.

The housing 12 may include external electrical connection elements for coupling with an external power source. The external electrical connection elements may be a plug configured to be plugged into an electrical outlet or battery terminals. Internal electrical connections couple the external electrical connection elements to the holder member 24 to provide power to the microfluidic refill cartridge. The housing 12 may include a power switch 42 on a front of the housing 12.

Figure 2A:
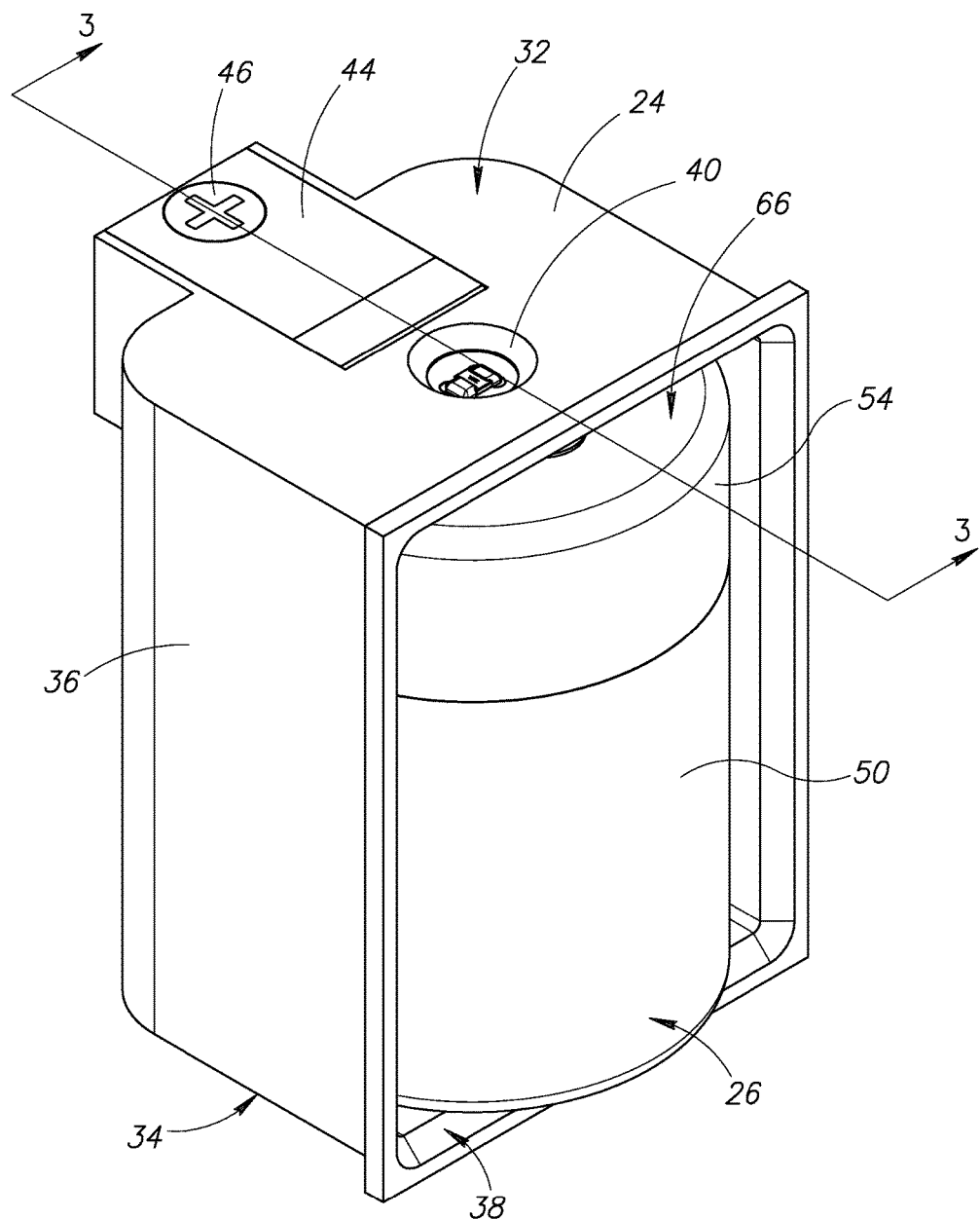
FIGS. 2A-2B are schematic isometric views of a microfluidic refill cartridge and a holder in accordance with one embodiment.
Figure 2B:
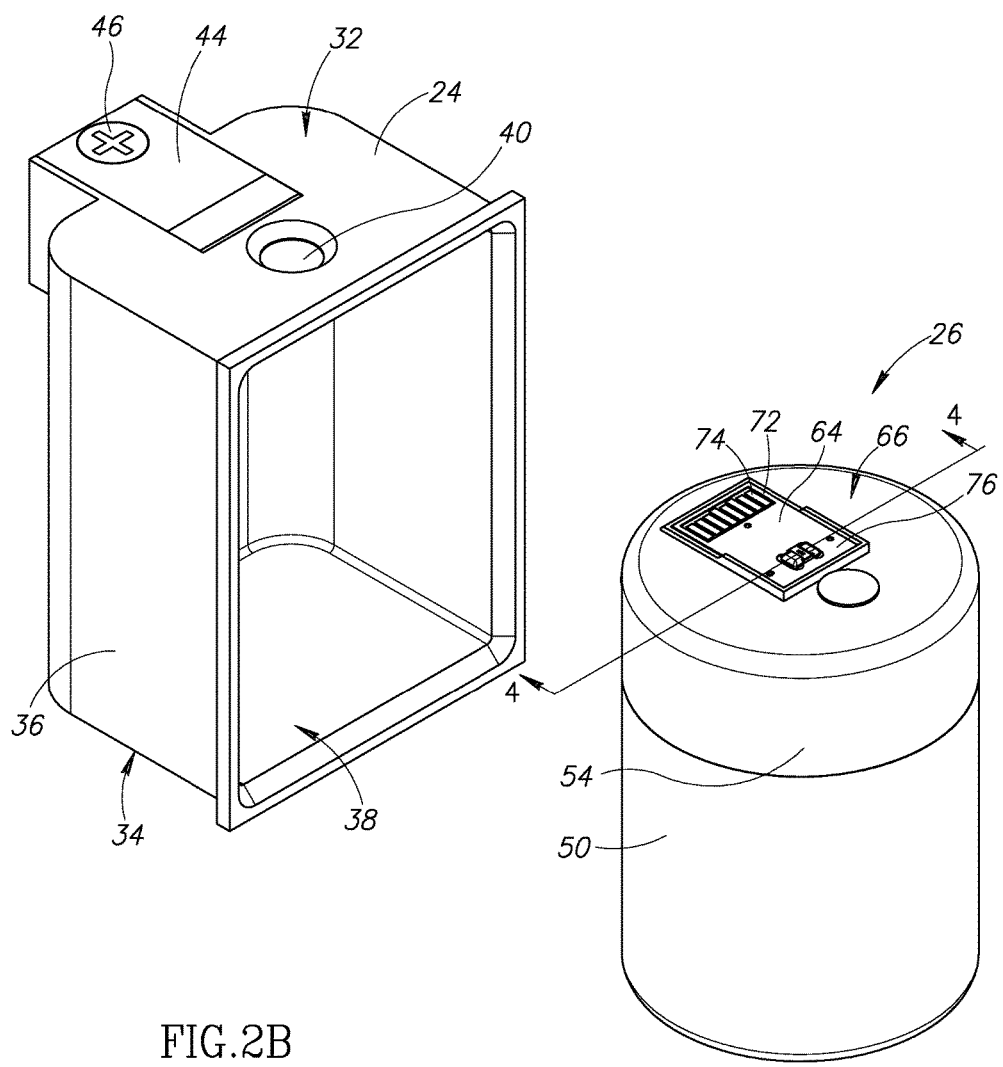

FIG. 2A shows the microfluidic refill cartridge 26 in the holder member 24 without the housing 12, and FIG. 2B shows the microfluidic refill cartridge 26 removed from the holder member 24. A circuit board 44 is coupled to the upper surface 32 of the holder member by a screw 46. As will be explained in more detail below, the circuit board 44 includes electrical contacts 48 that electrically couple to the microfluidic refill cartridge 26. The electrical contacts 48 of the circuit board 44 are in electrical communication with the internal and external electrical connection elements.

Figure 3:
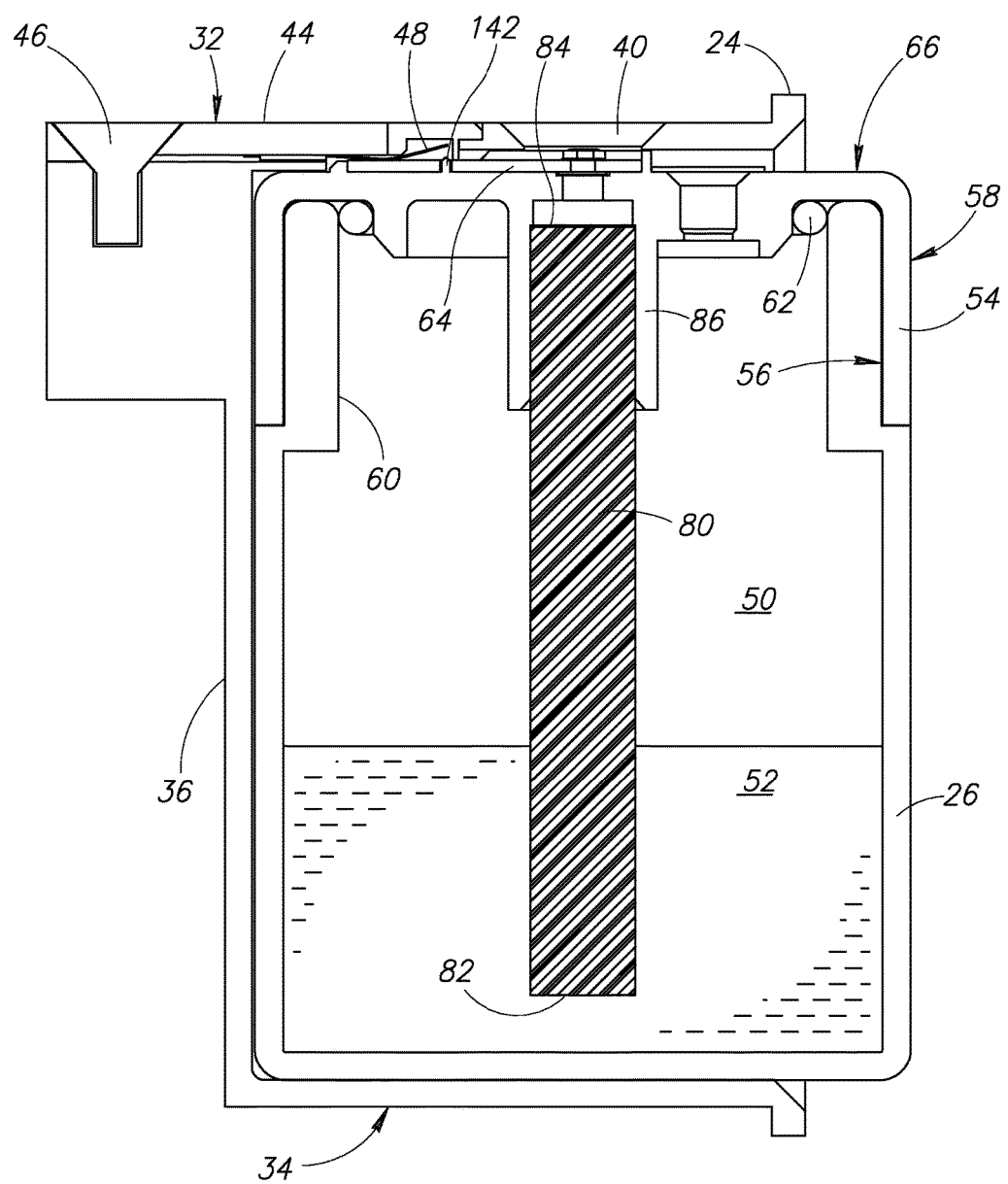
FIG. 3 is a cross-section schematic view of line 3-3 in FIG. 2A.

The microfluidic refill cartridge 26 includes a reservoir 50 for holding a fluid 52, see FIG. 3. The reservoir 50 may be any shape, size, or material configured to hold any number of different types of fluid. The fluid held in the reservoir may be any liquid composition. In one embodiment, the fluid is an oil, such as a scented oil. In another embodiment, the fluid is water. It may also be alcohol, a perfume, a biological material, a polymer for 3-D printing, or other fluid.

A lid 54, having an inner surface 56 and an outer surface 58, is secured to an upper portion 60 of the reservoir to cover the reservoir. The lid 54 may be secured to the reservoir to a variety of ways known in the art. Between the lid 54 and the reservoir 50 there may be an o-ring 62 for forming a seal therebetween to prevent fluid from flowing.

Figure 5A:
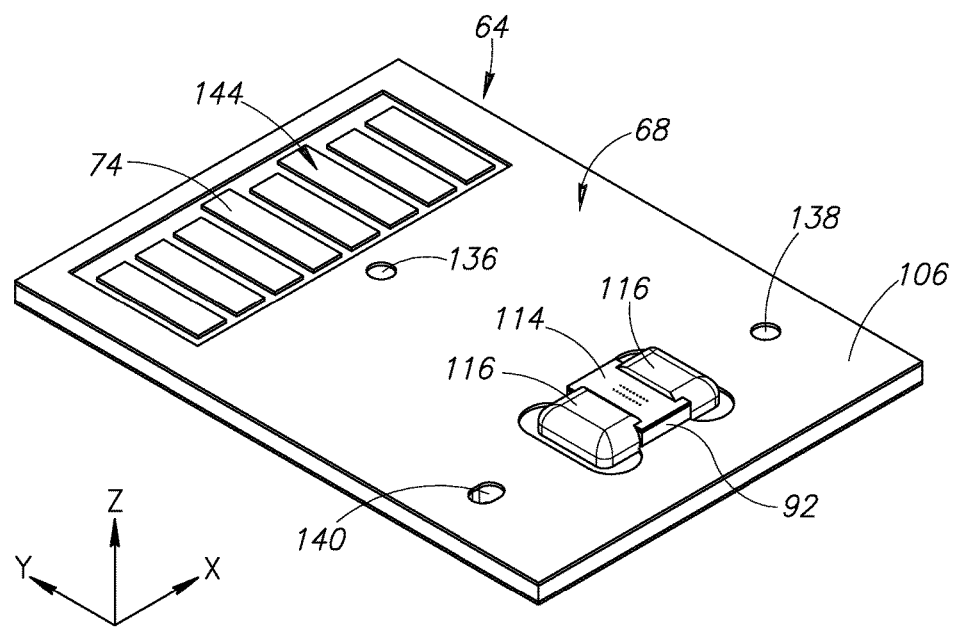
FIGS. 5A-5B are schematic isometric views of a microfluidic delivery member in accordance with an embodiment.
Figure 5B:
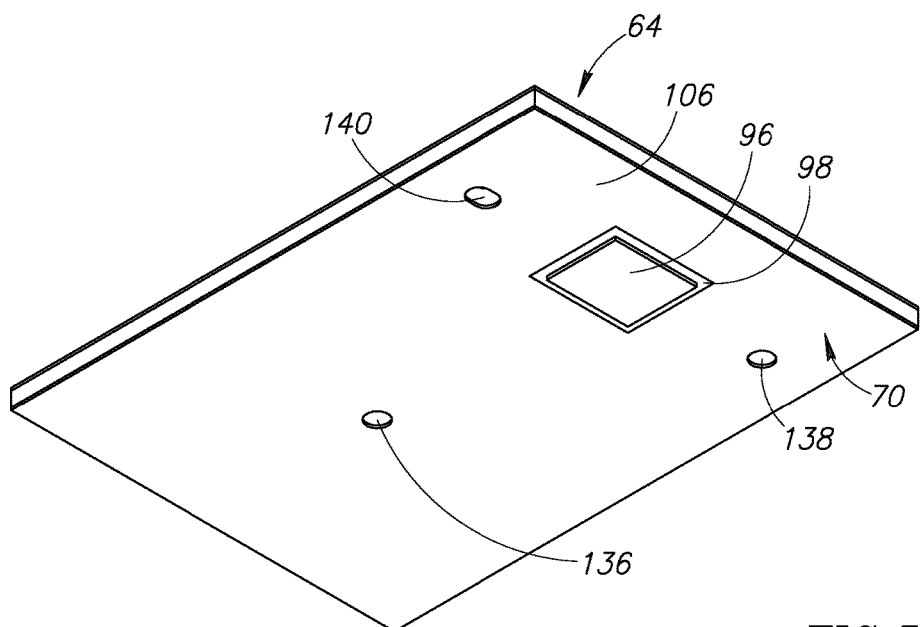

A microfluidic delivery member 64 is secured to an upper surface 66 of the lid 54 of the microfluidic refill cartridge 26. The microfluidic delivery member 64 includes an upper surface 68 and a lower surface 70 (see FIGS. 5A-5C). A first end 72 of the upper surface 68 includes electrical contacts 74 for coupling with the electrical contacts 48 of the circuit board 44 when placed in the holder member 24. As will be explained in more detail below, a second end 76 of the microfluidic delivery member 64 includes a part of a fluid path that passes through an opening 78 for delivering fluid.

FIG. 3 is a cross-section view of the microfluidic refill cartridge 26 in the holder member 24 along the line 3-3 shown in FIG. 2A. Inside the reservoir 50 is a fluid transport member 80 that has a first end 82 in the fluid 52 in the reservoir 50 and a second end 84 that is above the fluid. The second end 84 of the transport member 80 is located below the microfluidic delivery member 64. The fluid transport member 80 delivers fluid from the reservoir 50 to the microfluidic delivery member 64.

The fluid transport member 80 is configured to allow fluid in the reservoir 50 to travel from the first end 82 to the second end 84. In some embodiments, the fluid transport member 80 includes one or more porous materials that allow the fluid to flow from the first end 82 to the second end 84 by capillary action. The construction of the member 80 permits fluid to travel through the fluid transport member 80 against gravity. Fluid can travel by wicking, diffusion, suction, siphon, vacuum, or other mechanism.

In some embodiments, the fluid transport member 80 includes a polymer, non-limiting examples include polyethylene (PE), including ultra-high molecular weight polyethylene (UHMW), polyethylene terephthalate (PET), polypropylene (PP), nylon 6 (N6), polyester fibers, ethyl vinyl acetate, polyvinylidene fluoride (PVDF), and polyethersulfone (PES), polytetrafluroethylene (PTFE). The fluid transport member 80 may be in the form of fibers or sintered beads.

The fluid transport member 80 may be any shape that is able to deliver fluid from the reservoir 50 to the microfluidic delivery member 64. Although the fluid transport member 80 of the illustrated embodiment has a width dimension, such as diameter, that is significantly smaller than the reservoir 50, it is to be appreciated that the diameter of the fluid transport member 80 may be larger and in one embodiment substantially fills the reservoir 50.

Figure 4:
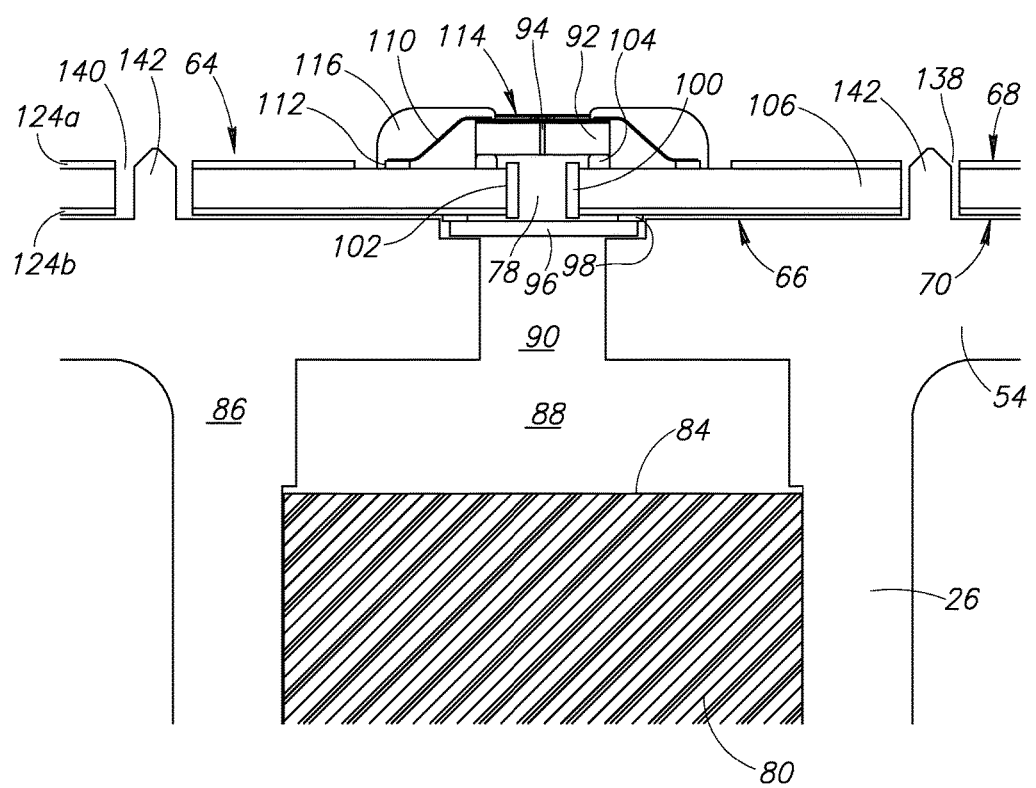
FIG. 4 is a cross-section schematic view of line 4-4 in FIG. 2B.

As best shown in FIG. 4, the second end 84 of the fluid transport member 80 is surrounded by a transport cover 86 that extends from the inner surface of the lid 54. The second end 84 of the fluid transport member 80 and the transport cover 86 form a chamber 88. The chamber 88 may be substantially sealed between the transport cover 86 and the fluid transport member 80 to prevent air from the reservoir 50 from entering the chamber 88.

Above the chamber 88 is a first through hole 90 in the lid 54 that fluidly couples the chamber 88 above the second end 84 of the fluid transport member 80 to the fluid path through the opening 78 of the microfluidic delivery member 64. The microfluidic delivery member 64 is secured to the lid 54 above the first through hole 90 of the lid and receives fluid.

As is shown in FIGS. 4 and 5A-5C, the microfluidic delivery member 64 may include a printed circuit board 106 that carries a semiconductor die 92. The printed circuit board 106 includes first and second circular openings 136, 138 and an oval opening 140. Prongs from the lid 54 extend through the openings 136, 138, 140 to ensure the board 106 is aligned with the fluid path appropriately. The oval opening 140 interacts with a wider prong so that the board 106 can only fit onto the lid 54 in one arrangement.

The upper and lower surfaces of the board may be coated with a solder mask 124a, 124b. Openings in the solder mask 124 may be provided where contact pads 112 of the die 92 are positioned on the circuit board 106 or at the first end 72 where the contacts 74 are formed. The solder mask 124 may be used as a protective layer to cover electrical connections (not shown) carried by the board 106 that couple the contact pads 112 of the die 92 to the electrical contacts 74, which couple the contact pads 112 to the external power source.

The printed circuit board 106 (PCB) is a rigid planar circuit board, having the upper and lower surfaces 68, 70. The circuit board 106 includes one or more layers of insulative and conductive materials. In one embodiment, the substrate 107 includes a FR4 PCB 106, a composite material composed of woven fiberglass with an epoxy resin binder that is flame resistant. In other embodiments, the substrate 107 includes ceramic, glass or plastic.

Figure 12:
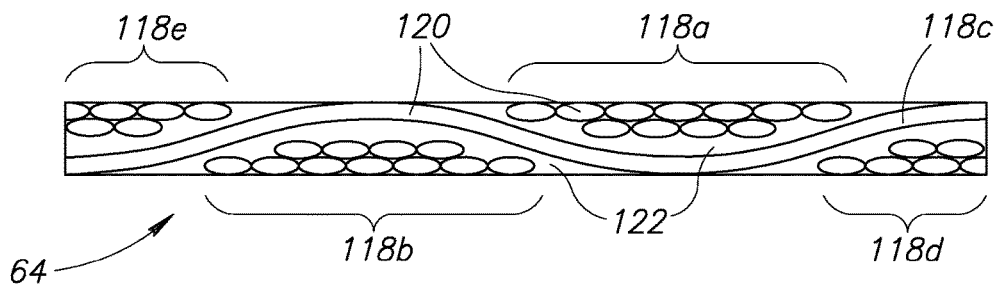
FIG. 12 is an enhanced cross-section view through a printed circuit board according to an embodiment.
Figure 13:
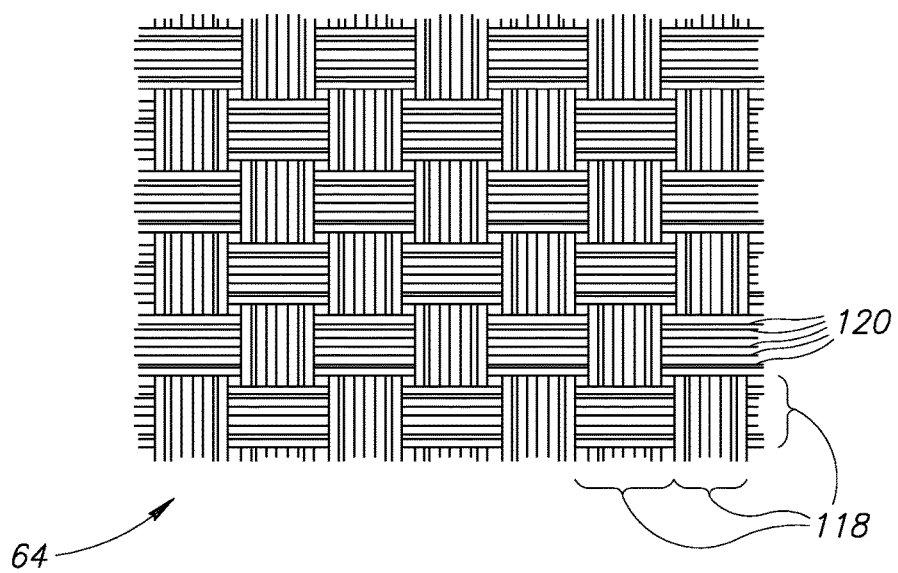
FIG. 13 is an enhanced to down view of a plurality of woven fibers in the printed circuit board of FIG. 12.

As is further shown in FIGS. 12 and 13, a FR4 PCB 106 includes a plurality of bundles 118 of fibers 120 that are woven together. FIGS. 12 and 13 are enhanced views of a FR4 PCB, such as the circuit board 106 described above. Some of the bundles 118, such as bundle 118a and bundle 118b, are adjacent to each other and extend in and out of FIG. 12. Other bundles, such as bundle 118c, are transverse to bundles 118a and 118b and extend left to right in FIG. 12. Each bundle alternates over and under adjacent transverse bundles. For example, bundle 118c is over bundle 118d, under bundle 118a, over bundle 118b, and under bundle 118e.

Each bundle 118 includes a plurality of fibers 120 or strands of flexible resilient material. In one embodiment, the fibers 120 are elongated fiberglass strands. FIG. 12 shows eleven fibers 120 per bundle, however the number of fibers 120 is illustrative and any number of fibers 120 may be utilized to achieve the PCB 106.

The bundles 118 are encased in a support material 122 that makes the composite material circuit board 106 rigid enough to support the die 92. The support material 122 may be a polymer or other material sufficient to bind the fibers 120 of the bundles 118 in the woven pattern. The support material 122 may be applied to the fiber bundles 118 in a liquid form so that the support material fills in spaces between the woven bundles. Alternatively, the woven bundles 118 of fibers 120 are placed between two polymer sheets and heated to form the support material. In one embodiment, the heat causes the polymer sheets to flow between the fibers 120 and bond to each other to form the support material 122. In another embodiment, the polymer sheets form a laminate of the support material over the bundles of fibers. Once solidified, the support material 122 is not brittle, which minimizes the risk of cracking during the packaging.

FIG. 13 is a top down view of the woven fibers 120 of the circuit board 106 arranged in the plurality of bundles 118. The over and under woven pattern forms a strong yet flexible material for supporting the die 92 and for simplifying the electrical connection to the external power source.

In one embodiment, the fibers 120 are flame resistant woven fiberglass cloth and the support material is a flame resistant epoxy resin binder. For example, FR-4 grade reinforced glass epoxy laminate sheet having the woven bundles of fibers. FR-4 grade is a high-pressure thermoset plastic laminate with good mechanical strength to weight ratios that maintains its mechanical qualities in dry and humid conditions. Fiberglass has high tensile strength with flexibility.

Returning to FIGS. 5A-5C, the fluid delivery system 64 is configured to provide a single, easily accessible and removable circuit board 106. In particular, the circuit board 106 includes all electrical connections on the upper surface 68 of the board 106. For example, a top surface 144 of the electrical contacts 74 that couple to the housing are parallel to an x-y plane. The upper surface 68 of the board 106 is also parallel to the x-y plane. In addition, a top surface 146 of a nozzle plate 132 of the die 92 is also parallel to the x-y plane. The contact pads 112 also have a top surface that is parallel to the x-y plane. By forming each of these features to be in parallel planes, the complexity of the board 106 is reduced and is easier to manufacture. In addition, this allows nozzles 130 to eject the fluid vertically (directly up or at an angle) away from the housing, such as could be used for spraying scented oils into a room as air freshener. This arrangement could create a scented plume 5-10 cm high.

The board 106 includes the electrical contacts at the first end and contact pads 112 at the second end proximate the die 92. Electrical traces from the contact pads 112 to the electrical contacts are formed on the board and may be covered by the solder mask or another dielectric.

On the lower surface of the board, the filter 96 may be provided to separate the opening 78 of the board 106 from the chamber 88 at the lower surface of the PCB. The filter 96 is configured to prevent at least some of the particles from passing through the opening to prevent clogging of the nozzles 130 of the die 92. In some embodiments, the filter 96 is configured to block particles that are greater than one third of the diameter of the nozzles 130. It is to be appreciated that in some embodiments, the fluid transport member 80 can act as a suitable filter 96, so that a separate filter 96 is not needed. In one embodiment, the filter 96 is a stainless steel mesh. In other embodiments, the filter 96 is randomly weaved mesh, polypropylene or silicon based.

The filter 96 is attached to the bottom surface with the adhesive material 98. The adhesive material 98 may be an adhesive material that does not readily dissolve by the fluid in the reservoir 50. In some embodiments, the adhesive material is activated by heat or UV.

The filter 96 is positioned between the chamber 88 and the die 92. The filter 96 is separated from the bottom surface of the microfluidic delivery member 64 by a first mechanical spacer 98. The first mechanical spacer 98 may be a rigid support or an adhesive that conforms to a shape between the filter 96 and the microfluidic delivery member 64. Alternatively, the adhesive material may be double sided tape, an adhesive paste, glue, or the like. In some embodiments, the adhesive may be thermally or ultraviolet (UV) activated.

The semiconductor die 92 is secured to the upper surface of the board above the opening. The semiconductor die 92 is secured to the upper surface of the board by any adhesive material configured to hold the semiconductor die to the board. The adhesive material may be the same or different from the adhesive material used to secure the filter 96 to the microfluidic delivery member 64.

Figure 5C:
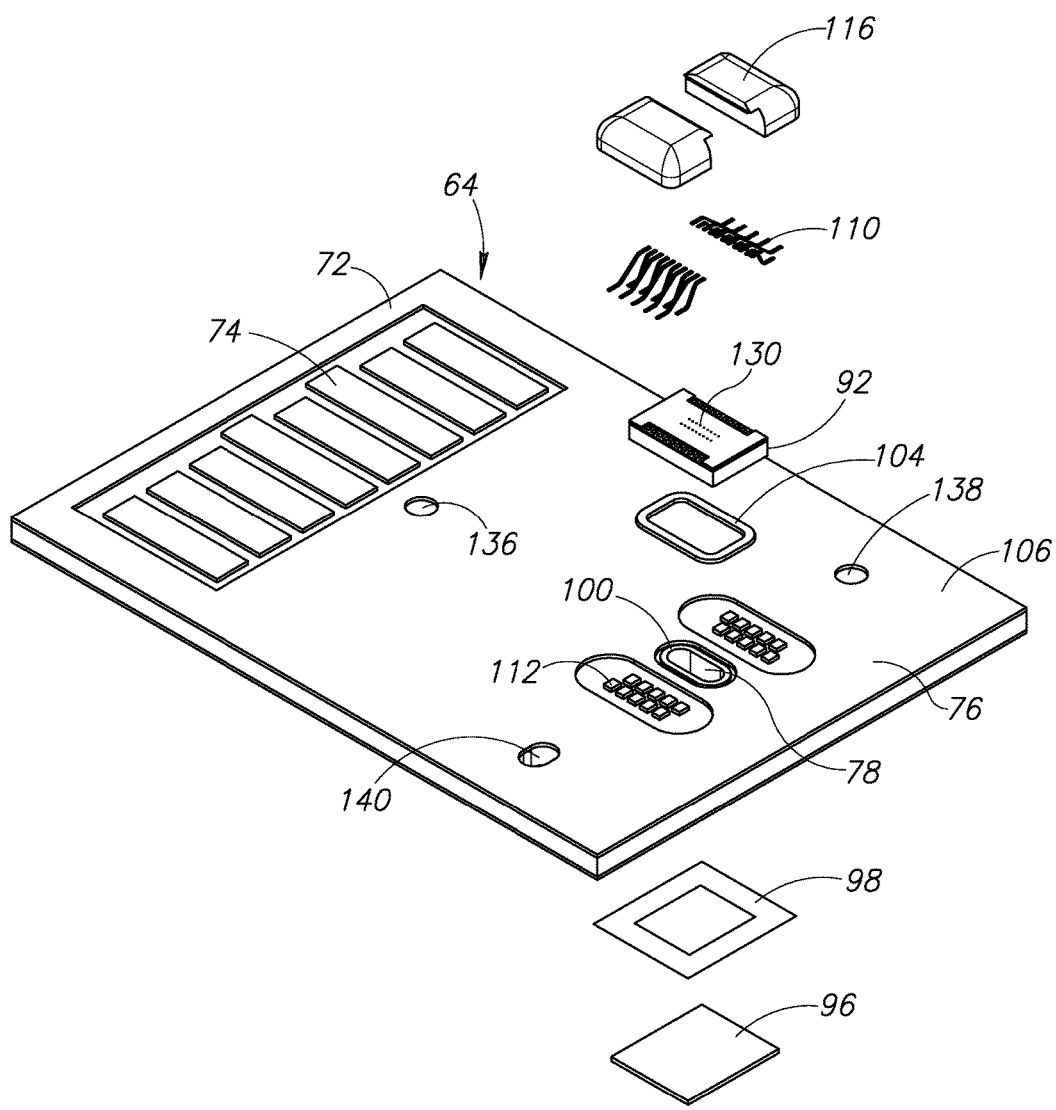
FIG. 5C is an exploded view of FIG. 5A.

The opening 78 may be formed as an oval, as is illustrated in FIG. 5c; however, other shapes are contemplated depending on the application. The oval may have the dimensions of a first diameter 1.5 mm and a second diameter of 700 microns. The opening 78 exposes sidewalls 102 of the board 106. If the board 106 is an FR4 PCB, the bundles of fibers would be exposed by the opening. These sidewalls are susceptible to fluid and thus a liner 100 is included to cover and protect these sidewalls. If fluid enters the sidewalls, the board could begin to deteriorate, cutting short the life span of this product.

The liner 100 is configured to protect the board from all fluids that an end user may select to eject through the die 92. For example, if the die 92 is used to eject scented oils from the housing, the liner 100 is configured to protect the sidewalls of the board 106 from any damage that could be caused by the scented oils. The liner 100 prolongs the life of the board 106 so that an end user can reuse the housing and the die 92 again and again with refillable or replaceable fluid cartridges.

These oils have different chemical properties than typical ink used with inkjet printers. Accordingly, the prior inkjet print heads used very expensive, very specific materials to prevent the ink from damaging the components that support the ink ejection process, such as the reservoir 50. In the present disclosure, common materials, such as an FR4 board can be utilized to create a sophisticated, but cost effective system. The liner 100 provides a protective coating to allow the cost effective FR4 board to be utilized in this system. In one embodiment, the liner is gold, however, in other embodiments the liner may be silicon nitride, other oxides, silicon carbide, other metals, such as tantalum or aluminum, or a plastic, such as PET.

The liner 100 in FIGS. 4 and 5C includes a vertical member that is adhered to the sidewall 102. In other embodiments described below, the liner may include top and bottom extensions that overlap the upper and lower surfaces of the board, such that the liner includes corners that wrap around the exposed corners formed by the sidewalls and the opening. In one embodiment, the liner is a metal material, such as gold. In other embodiments, liner is an inert material, which is less likely to interact with a fluid selected for use in the cartridge.

A second mechanical spacer 104 separates a bottom surface 108 of the die 92 from the upper surface 68 of the printed circuit board 106. An encapsulant 116 covers the contact pads 112 and leads 110, while leaving a central portion 114 of the die exposed.

Figure 6A:
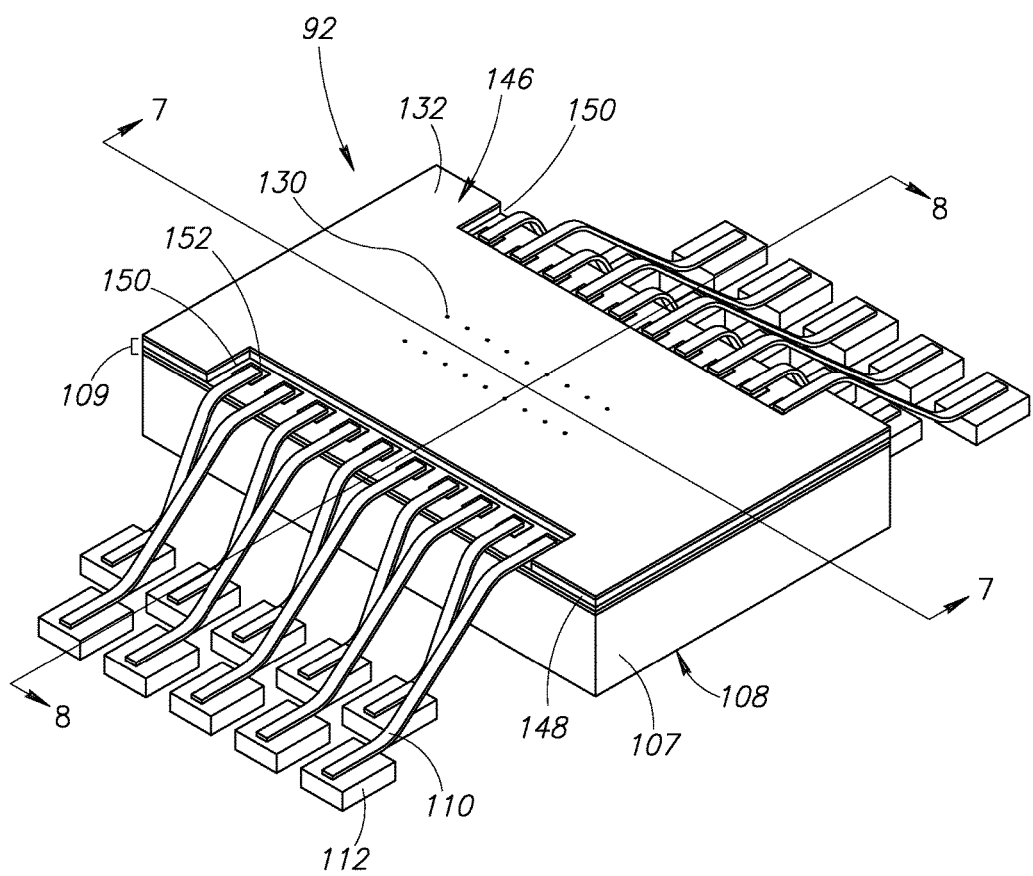
FIGS. 6A-6C are schematic isometric views of a microfluidic die at various layers in accordance with another embodiment.
Figure 6B:
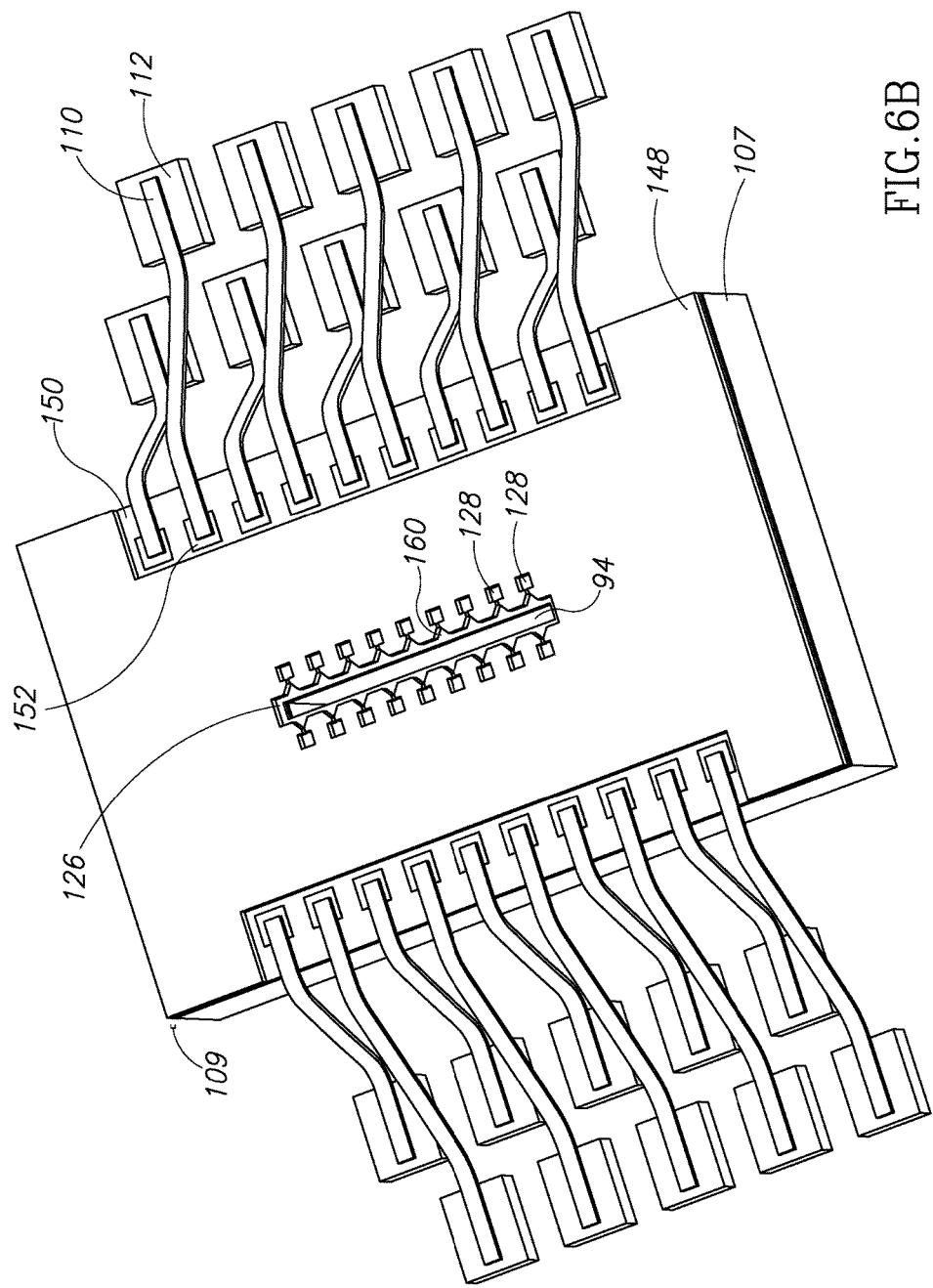
Figure 6C:
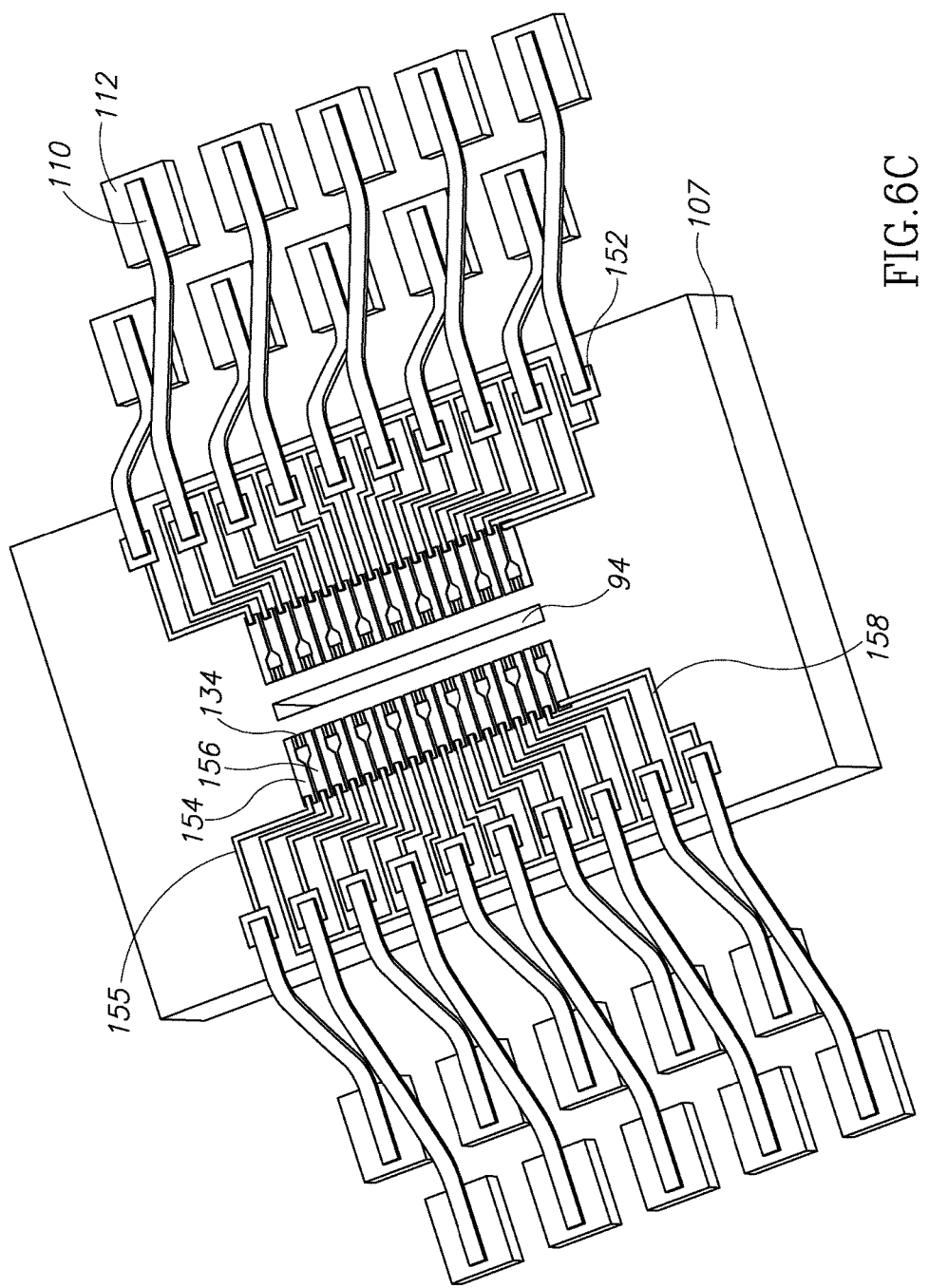

FIGS. 6A-6C include more details of the microfluidic die 92. The microfluidic die 92 includes a substrate 107, a plurality of intermediate layers 109, and a nozzle plate 132.

The plurality of intermediate layers 109 include dielectric layers and a chamber layer 148 that are positioned between the substrate and the nozzle plate. In one embodiment, the nozzle plate is 12 microns thick.

The die 92 includes a plurality of electrical connection leads that extend from one of the intermediate dielectric layers 109 down to the contact pads 112 on the circuit board 106. Each lead couples to a single contact pad. Openings 150 on the left and right side of the die provide access to the intermediate layers 109 to which the leads are coupled. The openings 150 pass through the nozzle plate 132 and chamber layer 148 to expose contact pads 152 that are formed on the intermediate dielectric layers. In other embodiments that will be described below, there may be one opening 150 positioned on only one side of the die such that all of the leads that extend from the die extend from one side while other side remains unencumbered by the leads.

In the illustrated embodiment, there are 18 nozzles 130 through the nozzle plate 132, nine nozzles on each side of a center line. FIG. 6B is a top down isometric view of the die 92 with the nozzle plate 132 removed, such that the chamber layer 148 is exposed. In some embodiments, the nozzle has a diameter between 20-30 microns. Each nozzle is in fluid communication with the fluid in the reservoir 50 by a fluid path that includes the first end 82 of the fluid transport member 80, through the transport member 80 to the second end 84, the chamber 88 above the second end 84 of the transport member, the first through hole 90 of the lid 54, the opening 78 of the PCB, through an inlet 94 of the die 92, then through a channel 126, and to the chamber 128, and out of the nozzle 130 of the die.

The die 92 includes an inlet path 94 that passes completely through the substrate 107 and interacts with the chamber layer 148 and the nozzle plate 132. The inlet path 94 is a rectangular opening, however, other shapes may be utilized according to the flow path constraints. The inlet path 94 is in fluid communication with the fluid path that passes through the opening 78 of the board 106, see FIG. 4.

The inlet path 94 is coupled to a channel 126 (see FIGS. 7A-7B) that is in fluid communication with individual chambers 128, forming the fluid path. Above the chambers 128 is the nozzle plate 132 that includes the plurality of nozzles 130. Each nozzle 130 is above a respective one of the chambers 128. The die 92 may have any number of chambers and nozzles, including one chamber and nozzle. In the illustrated embodiment, the die includes 18 chambers each associated with a respective nozzle. Alternatively, it can have ten nozzles and two chambers provided fluid for a group of five nozzles. It is not necessary to have a one-to-one correspondence between the chambers and nozzles.

Proximate each nozzle chamber is a heating element 134 (see FIGS. 6C and 8B) that is electrically coupled to and activated by an electrical signal being provided by one of the contact pads 152 of the die 92. Each heating element 134 is coupled to a first contact 154 and a second contact 156. The first contact 154 is coupled to a respective one of the contact pads 152 on the die by a conductive trace 155. The second contact 156 is coupled to a ground line 158 that is shared with each of the second contacts 156 on one side of the die. In one embodiment, there is only a single ground line that is shared by contacts on both sides of the die. Although FIG. 6C is illustrated as though all of the features are on a single layer, they may be formed on several stacked layers of dielectric and conductive material.

In use, when the fluid in each of the chambers 128 is heated by the heating element 134, the fluid vaporizes to create a bubble. The expansion that creates the bubble causes fluid to eject from the nozzle 130 and to form a droplet.

Figure 7A:
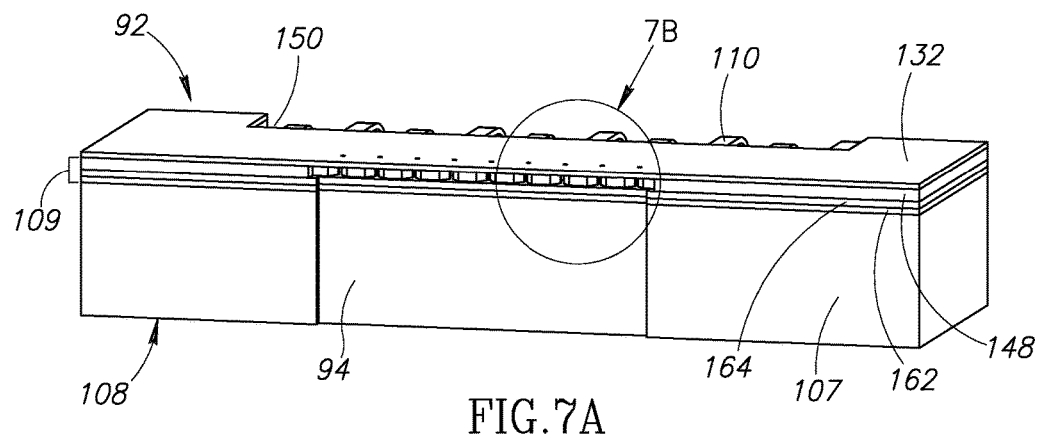
FIG. 7A is a cross-section view of line 7-7 in FIG. 6A.

FIG. 7A is a cross-section view through the die of FIG. 6, through cut lines 7-7. As mentioned above, the substrate 107 includes the inlet path 94 through a center region associated with the chambers 128 and the nozzles 130. The inlet path is configured to allow fluid to flow up from the bottom surface 108 of the die into the channels which couple to the nozzle chambers and heat the fluid to be ejected out of the nozzles.

The chamber layer 148 defines angled funnel paths 160 that feed the fluid from the channel 126 into the chamber 128. The chamber layer 148 is positioned on top of the intermediate dielectric layers 109. The chamber layer defines the boundaries of the channels and the plurality of chambers associated with each nozzle. In one embodiment, the chamber layer is formed separately in a mold and then attached to the substrate. In other embodiments, the chamber layer is formed by depositing, masking, and etching layers on top of the substrate.

The intermediate layers 109 include a first dielectric layer 162 and a second dielectric layer 164. The first and second dielectric layers are between the nozzle plate and the substrate. The first dielectric layer 162 covers the plurality of first and second contacts 154, 156 formed on the substrate and covers the heaters 134 associated with each chamber. The second dielectric layer 164 covers the conductive traces 155.

Figure 7B:
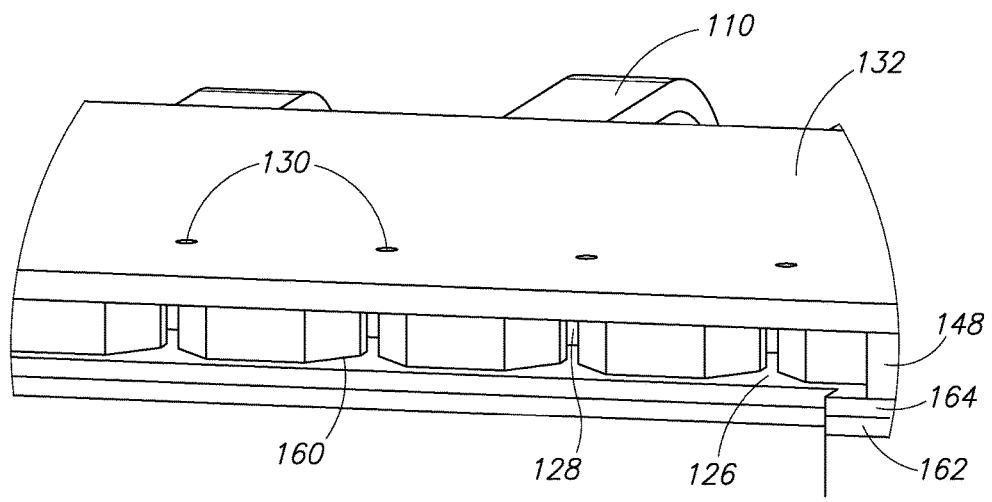
FIG. 7B is an enlarged view of a portion of FIG. 7A.

FIG. 7B is an enhanced view of a region of FIG. 7A. This enhanced view includes four nozzles formed in the nozzle plate, which are associated with four chambers positioned under each nozzle. The channel feeds fluid into each chamber through the funnel path.

Figure 8A:
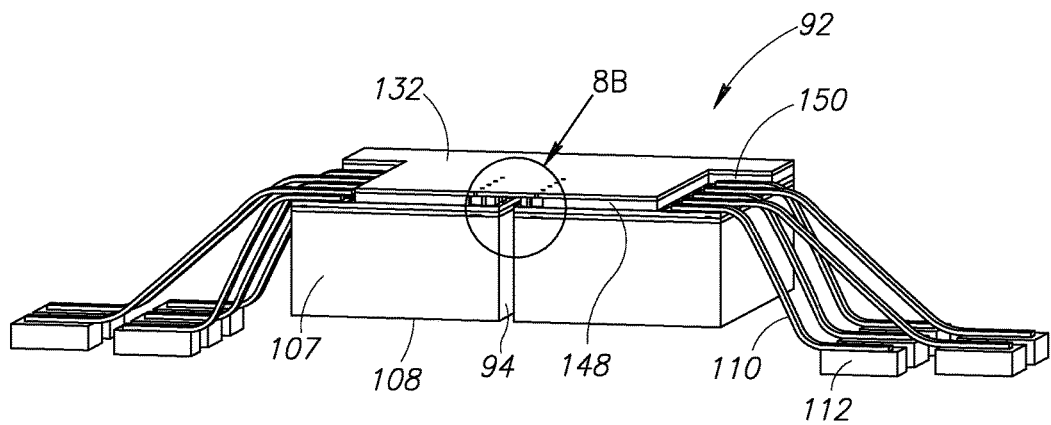
FIG. 8A is a cross-section view of line 8-8 in FIG. 6A.
Figure 8B:
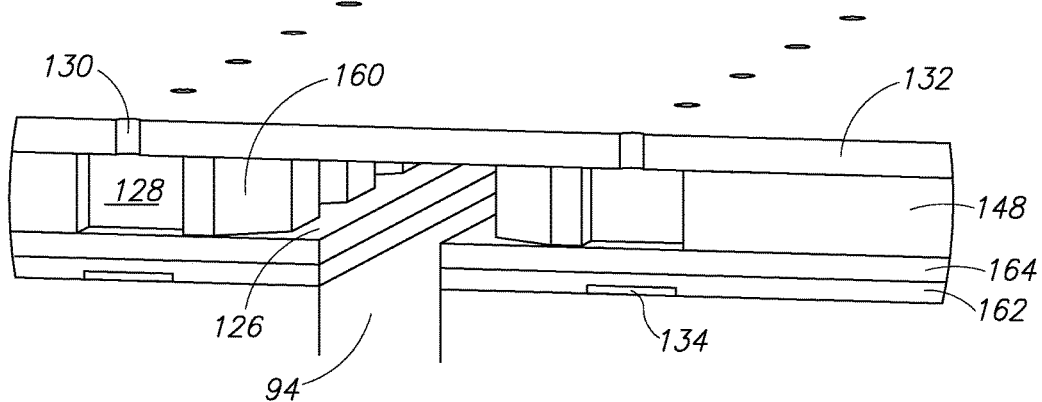
FIG. 8B is an enlarged view of a portion of FIG. 8A.

FIG. 8A is a cross-section view through the die along the cut line 8-8 of FIG. 6. This cross-section is perpendicular to the cross-section of FIG. 7A. The inlet can be seen extending from the bottom surface of the die up to the channel. The inlet, as described above, allows fluid to flow from an external device, such as the cartridge described above. The inlet is in fluid communication with the channels and with the chambers, which are configured to eject the fluid through the nozzles in use. FIG. 8B is an enhanced cross-sectional view of a region of FIG. 8A. In this view, the heaters formed on the substrate are positioned below the chambers.

Figure 9A:
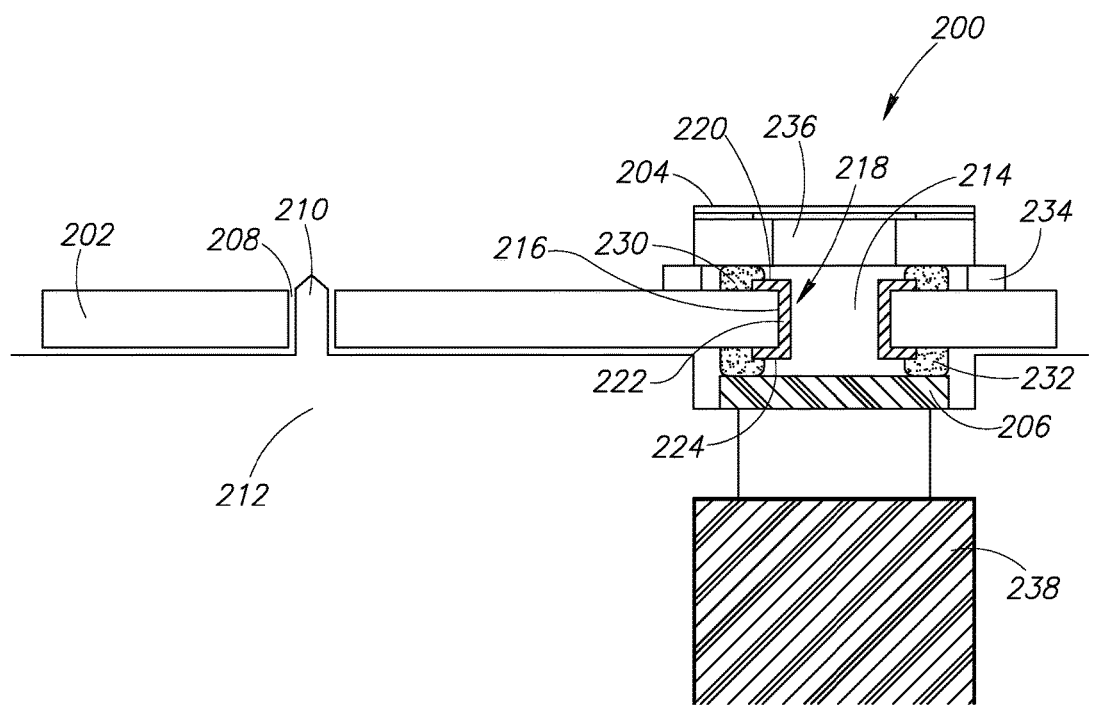
FIGS. 9A-9B are cross-section views of an alternative embodiment of a microfluidic delivery member.

FIG. 9A is a cross-sectional view of an alternative embodiment of a microfluidic delivery member 200. The delivery member 200 includes a printed circuit board 202, a die 204, and a filter 206. This cross-sectional view is along a length of the board, such as from the first end to the second end of the example board shown in FIGS. 5A-5C. The cross-section passes through a hole 208 in the board that is configured to receive a post 210 coupled to a cap 212 of a fluid cartridge.

The cross-section also passes through an opening 214 in the board that is aligned with a fluid delivery path of the cartridge. The opening 214 exposes sidewalls 216 of the board. The sidewalls 216 are covered with a liner 218 of an inert material. In this embodiment, the liner 218 has a first portion 220, a middle portion 222, and a second portion 224. The first portion 220 is on a top surface 226 of the board and the second portion 224 is on a bottom surface 228 of the board. The middle portion 222 couples the first portion to the second portion in a C and reverse C shape in this cross-section. The first portion 220 may have a width from an outer edge to an inner edge of 0.25 mm, where the inner edge is coplanar with the middle portion 222.

The printed circuit board may be formed from a plurality of interwoven fibers, which can be seen in more detail in FIGS. 12 and 13. This plurality of fibers is exposed when the opening is formed through the board. If fluid contacts this plurality of fibers, the printed circuit board can fail and become insufficient for maintaining the fluid path from the cartridge through the printed circuit board to the die.

The liner 218 is formed on the exposed sidewalls of the board to prevent fluid from interacting with the exposed fibers. There is a first adhesive 230 on the top surface of the board between the die 204 and the first portion 220 of the liner. The first adhesive 230 covers an outermost end of the liner that is furthest from the opening 214. The adhesive 230 prevents the fluid from interacting with the top surface of the board.

A second adhesive 232 is positioned between the bottom surface of the board and the filter 206. The second adhesive overlaps with an outermost end of the liner to prevent any fluid from interacting with the bottom surface of the board 202. The filter 206 interacts with the adhesive 232 on the bottom surface of the printed circuit board while the die 204 interacts with the adhesive 230 on the top surface of the printed circuit board 202.

The adhesive 232 may extend over an end of the filter 206 to prevent fluid from exiting from sides of the filter and interacting with the bottom surface of the board. In other embodiments, the sides of the filter 206 remain exposed. In some embodiments, the sides of the filter 206 have a protective layer to prevent the fluid from exiting from the sides.

A mechanical support 234 is provided on the top surface of the printed circuit board 202 between the printed circuit board and the die 204. This mechanical support supports the die 204 to provide even distribution of the weight of the die. This mechanical support is optional.

The die includes an inlet path 236 in fluid communication with the opening 214 and the filter 206. The inlet path 236 is also in fluid communication with a wick 238 that is in the cartridge.

The liner can be configured to cover all exposed surfaces of the board to separate all surfaces of the board from the fluid.

Figure 9B:
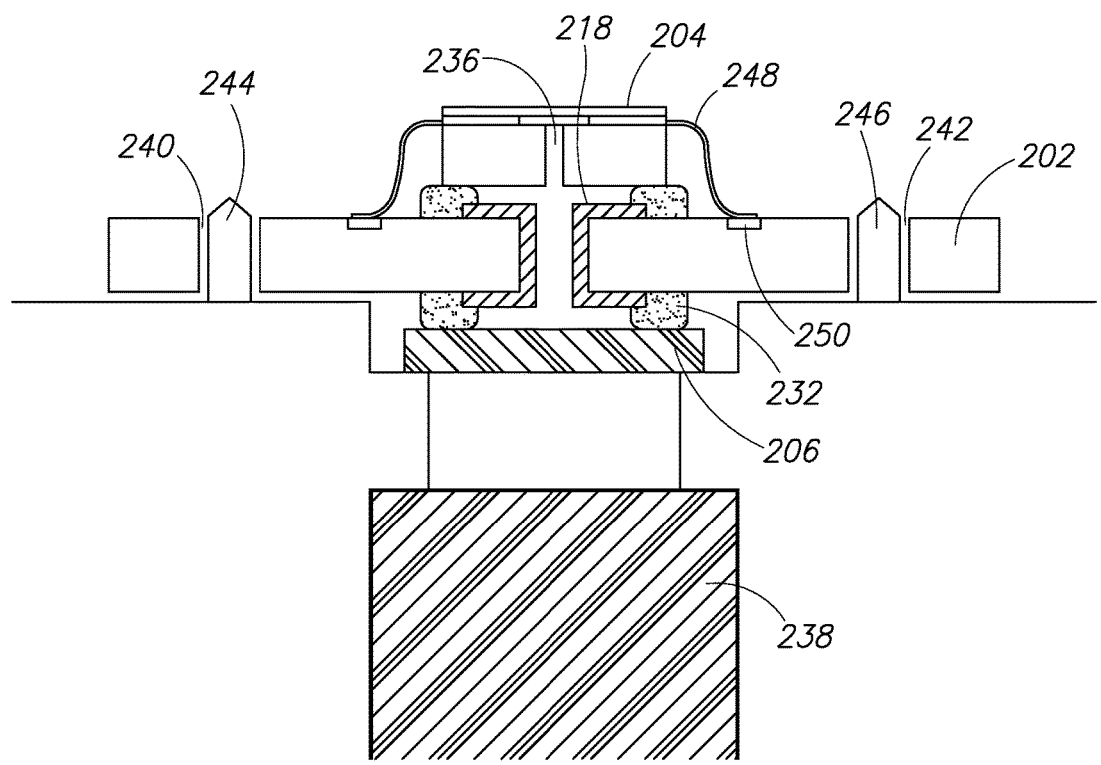

FIG. 9B is a cross-sectional view through the same board and microfluidic delivery member of 9A taken at a cross-section that is perpendicular to the cross-section with respect to FIG. 9A. The board includes additional openings 240 and 242 through which posts 244, 246 extend to hold the board in place.

The inlet path 236 is thinner in this view because the path is rectangular in shape, similar to the die in FIGS. 6A-6C. Electrical leads 248 extend from the die down to contacts 250 formed in the top surface of the board.

In this cross-section the first and second portions of the liner 218 on the top and bottom surface of the board is wider than in FIG. 9A. The first and second portions may be wider or the same size as the first and second portions of FIG. 9A.

Figure 10:
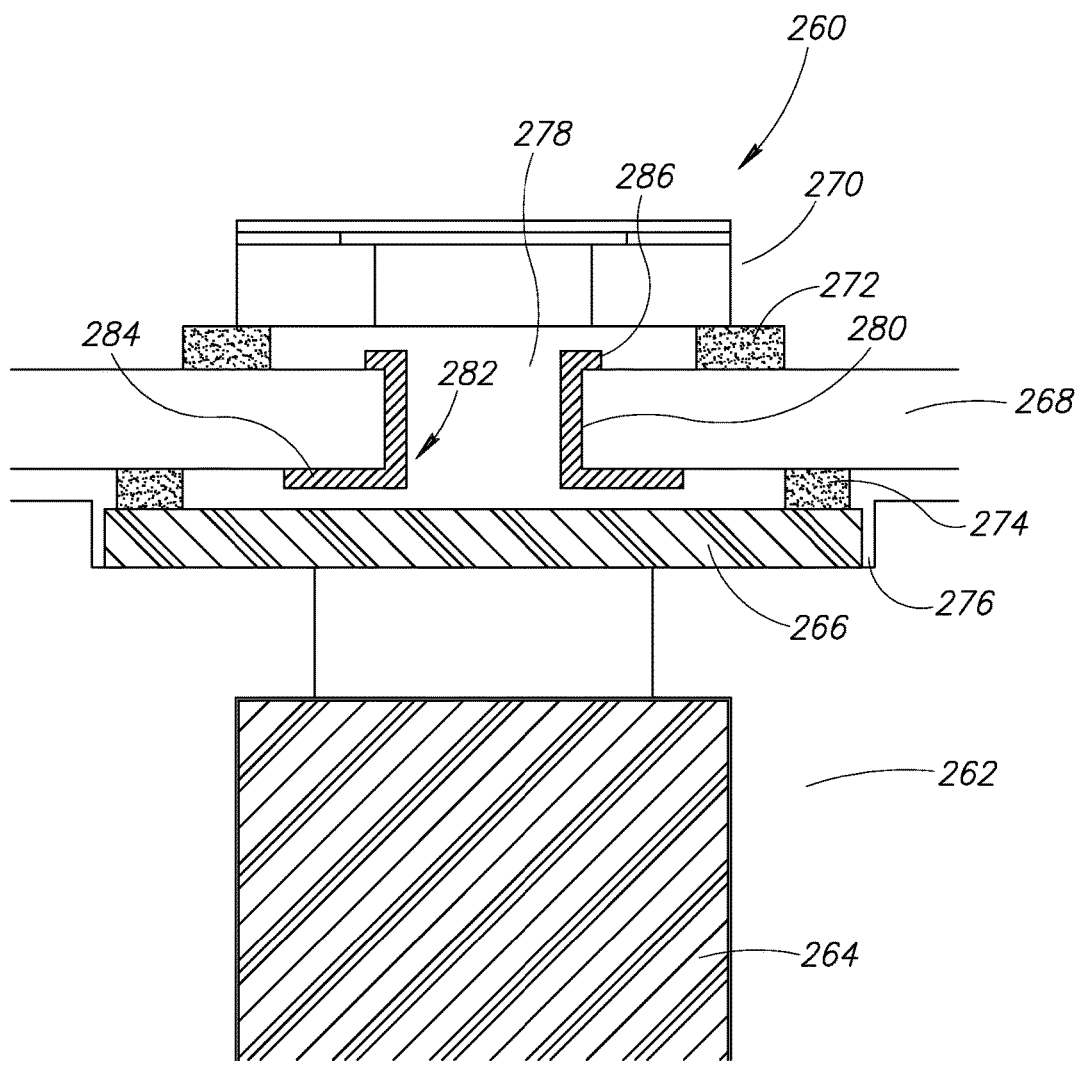
FIG. 10 is a cross-section view of an alternative embodiment of a microfluidic delivery member.

FIG. 10 is an alternative embodiment of a microfluidic delivery member 260 formed in accordance with the present disclosure. This microfluidic delivery member 260 is in fluid communication with a delivery cartridge 262 that includes a wick 264. The microfluidic delivery member includes a filter 266, a printed circuit board 268, and a die 270.

The die 270 is coupled to a top surface of the printed circuit board with a mechanical support 272, which may include, or be, an adhesive. The filter 266 is coupled to a bottom surface of the printed circuit board with another mechanical support 274. The filter rests on a ledge 276 formed in the cartridge 262.

The board 268 includes an opening 278 that exposes sidewalls 280. If left uncovered, these sidewalls can be impacted by the flow of fluid from the cartridge up through the die. A liner 282 covers the sidewalls 280 and corners of the board 268. In this embodiment, a bottom 284 of the liner has a larger width than a top 286 of the liner. The width of the top and bottom surfaces may be varied according to use.

In this embodiment, top and bottom surfaces of the board are exposed to the fluid. Because the boards are usually coated with a protective layer or a dielectric layer, there are some embodiments where adhesive can be omitted and only the sidewalls are protected from the fluid.

In addition, if the liner is made of gold, it is difficult to get other materials to adhere to the gold liner, thus, often the gold liner will be separate from the adhesive such that some of the top and bottom surface of the board is exposed. If the gold liner is formed, the gold liner may actually be a stack of layers. For example, a copper layer may be formed on the board, a nickel layer may be formed on the copper layer, and the gold layer may be formed on the nickel layer. The copper and nickel layers are pre-plating layers that help adhere the gold to the board.

In each of these embodiments, the liner can be an inert material, such as gold, that prevents the fluid from interacting with sidewalls of the board. As noted above, the opening through the board may be oval. The oval shape is advantageous because corners can create weak spots that can degrade and leak over time.

Figure 11:
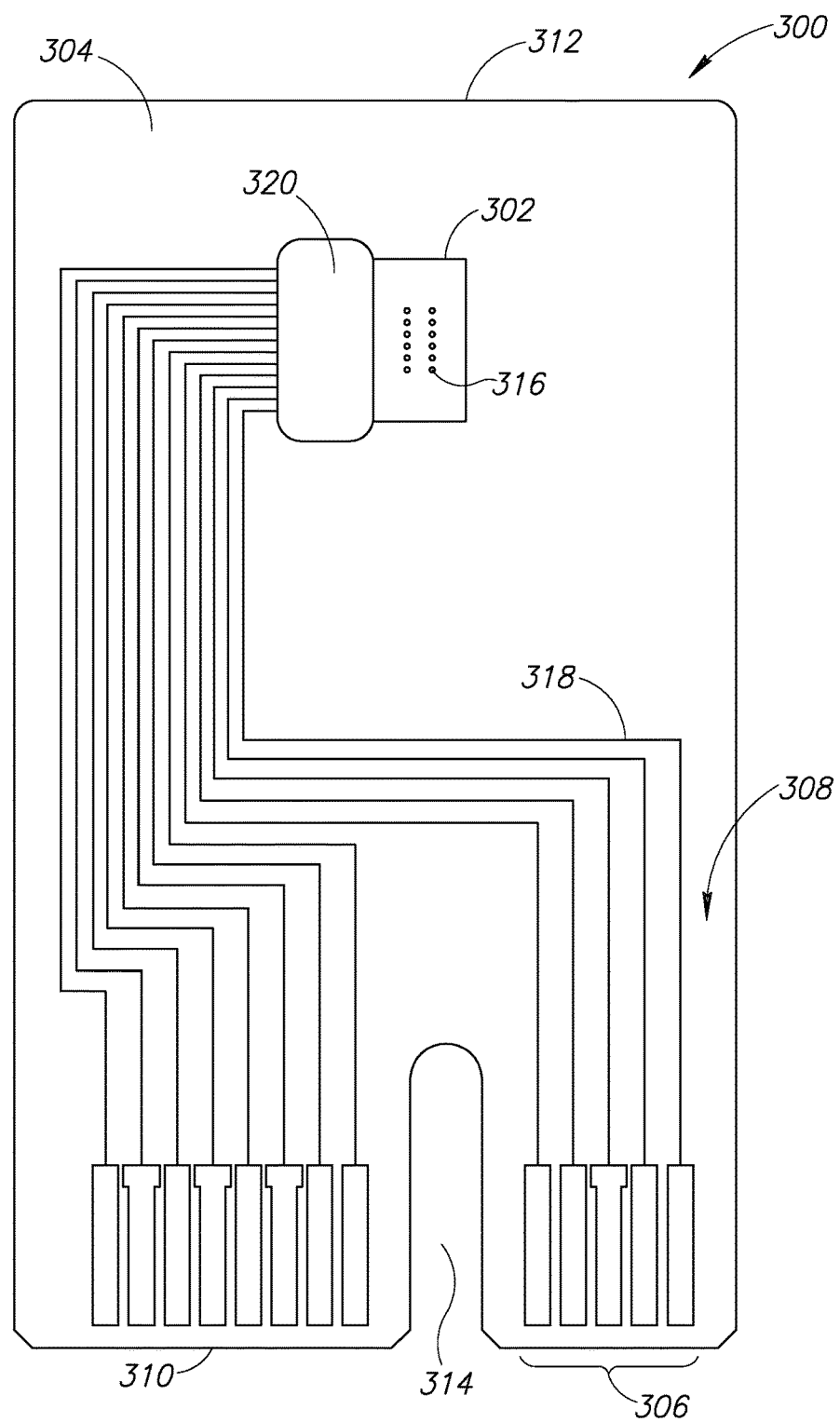
FIG. 11 is a top down view of an alternative embodiment of a microfluidic delivery member.

FIG. 11 is directed to another embodiment of the present disclosure and includes a printed circuit mounting system 300 for a thermal inkjet die 302. The die could be other types of ejector die, such as piezo ejection, ultrasonic ejection, and other mechanical ejection of a fluid. The mounting system includes a printed circuit board 304 formed of a composite material, such as woven fibers or other suitable layered material. One example of the composite material is FR4, which includes a plurality of bundles of fibers (see FIGS. 12 and 13). FR4 is a cheap and easily accessible material that can keep costs down so that the microfluidic delivery system 64 can be utilized in a variety of new environments, such as for ejecting scented oils vertically from the die. They may also be used in the medical field to vaporize medicine for a patient to inhale. Using the proposed microfluidic delivery system as described herein can give the patient or physician precise control over the rate and time of the dosage. For example, the physician could program the system 300 to vaporize the medicine for 20 second bursts spaced by 60 seconds without medicine for a period of time. Further, two or more die can be mounted side-by-side to deliver two or more different types of vapors to a patient using the same electronic controls.

The board 304 is a rigid material that provides consistent and reliable support for the die 320. The board 304 may alternatively be glass, silicon, or any other industry accepted standard circuit board. The board 304 includes a plurality of contact pads 306 on a top surface 308 positioned near a first end 310. The die 302 is positioned near a second end 312 that is opposite to the first end 310. There is a notch 314 in the first end 310 that provides guidance for insertion of the board into the housing and ensures it can only be inserted one way.

The die includes 12 nozzles 316 formed through nozzle plate. There are 13 contact pads 306 that provide electrical control signals to dictate when the die ejects fluid. The contact pads 306 couple to the die through a plurality of traces 318 that are formed in the top surface of the board. Twelve of the contact pads 306 are connected to 12 heaters positioned underneath a chamber under each nozzle. The thirteenth contact pad is coupled to ground. Each of the heaters share the same ground line. If all nozzles will always eject fluid together, the control pads 306 can be only two, one power and one ground, that connect in parallel to all heaters. Alternatively, there can be two power pads 306 and two ground pads 306 that are electrically separate but driven together to provide back-up or redundancy to increase the reliability. The nozzles 316 can also be connected and driven as two banks.

An encapsulant 320 covers leads that extend from a layer of the die out to the surface of the board. In this embodiment, there is only encapsulant on one side of the die. It is beneficial to minimize the amount of encapsulant used because encapsulant can move around before it is cured into its final shape. If the encapsulant is too close to the nozzles, it can affect the performance of the nozzles. In order to have the encapsulant on one side of the die, each of the electrical paths through the die must all be exposed from one side.

In one embodiment, the traces 318, the contact pads 306, and the contacts from the leads of the die are all formed in the same plane on the top surface of the board. In addition, the bottom surface of the die may rest in the same plane such that the nozzles are in a plane parallel to the plane of the leads, contacts, and contact pads.

In one embodiment, the die 92 includes active circuitry including transistors, resistors, capacitors, and other features that are configured to drive the heaters and eject fluid out of the nozzles. In other embodiments, the die 92 does not include any active circuitry and only includes electrical connections to the heaters. This other embodiment will be controlled and driven by a controller that is spaced from the die and is also spaced from the board 106.

Figure 14:
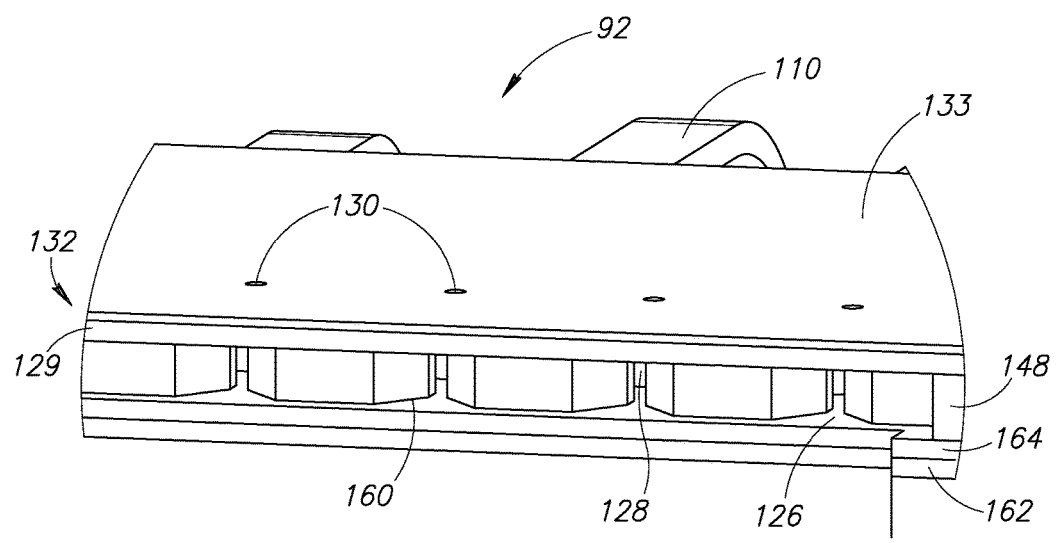
FIG. 14 is a cross-section through an alternative embodiment of a die formed in accordance with the present disclosure.

FIG. 14 is an enhanced cross-section through an alternative embodiment of a die formed in accordance with the present disclosure. The die is similar to the die described above with respect to FIGS. 6A-6C and 7A-7B. Similar features are described using the same reference numbers as FIGS. 6A-6C and 7A-7B. The die 92 includes the plurality of dielectric layers 162, 164, the chamber layer 148, and the nozzle plate 132. The nozzles 130 are formed through the nozzle plate 132. The channel 126 feeds fluid into the chambers 128 and ejects the fluid through the nozzles.

The nozzle plate includes a first layer 129 that is a structural support layer that forms a main portion of each nozzle. The nozzle plate includes a second layer 133 that is a vapor barrier layer. This second layer 133 may be a thin film layer that is formed to prevent fluid from evaporating through the first layer 129.

In one embodiment, the first layer 129 is a polymer material that is permeable by ethanol. Some fluids, such as scented oils are blended with a portion of ethanol so that the fluid will quickly evaporate when ejected from the die. Ethanol and other volatile compounds that may be added to the scented oil or other fluid for ejection can be prone to evaporation. These volatile compounds may be added to increase vapor pressure through the die. Some polymers used for the first layer 129 of the nozzle plate allow ethanol to escape and evaporate. Over time, if the ethanol or volatile liquid escapes or evaporates the remaining fluid will have a different, less desirable, consistency. The ethanol can increase the vapor pressure, which in turn creates a more powerful ejection.

The second layer 133 is configured to prevent ethanol from diffusing through the first layer 129. The second layer 133 may be a metal, such as aluminum formed to be 1,000 Angstroms thick. Other metals or materials can be utilized that prevent ethanol or other liquids from evaporating through the nozzle plate. In addition, various thickness can be utilized as dictated by the selected material. For example, the second layer 133 may be a barrier layer deposited using atomic layer deposition or a sputter process.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic subsystem, comprising:
    a printed circuit board having a first surface and a second surface, the printed circuit board having a plurality of woven insulating fibers between the first and the second surfaces, the printed circuit board including:
        a fluid path that extends through the printed circuit board;
        a first opening through the printed circuit board, the first opening aligned with the fluid path;
        an internal sidewall formed by the first opening; and
        a liner layer covering the entire internal sidewall of the printed circuit board, the liner layer being a dielectric;
    a microfluidic die on the first surface of the printed circuit board, the die having:
        an inlet path in fluid communication with the fluid path and the first opening of the printed circuit board;
        a plurality of chambers;
        a plurality of heaters, each of the plurality of heaters being configured to heat one of the chambers; and
        a plurality of nozzles in fluid communication with the inlet path, each chamber of the plurality of chambers separating a nozzle of the plurality of nozzles from a heater of the plurality of heaters;
    a first adhesive positioned on the second surface of the printed circuit board, the first adhesive being in contact with a first portion of the liner layer; and
    a second adhesive positioned between the printed circuit board and the die, the second adhesive being in contact with the die and a second portion of the liner layer.

2. The electronic subsystem of claim 1, further comprising:
    a filter on the second surface of the printed circuit board.

3. The electronic subsystem of claim 1 wherein the first portion of the liner layer is on the first surface of the printed circuit board, and the second portion of the liner layer is on the second surface of the printed circuit board.

4. An electronic subsystem, comprising:
a rigid support member having a first surface and a second surface, the rigid support member including:
- a plurality of woven fibers;
- a plurality of contact pads on the first surface at a first end of the rigid support member;
- a first opening through the rigid support member at a second end of the rigid support member, the first opening exposing an interior surface of the rigid support member that extends from the first surface to the second surface of the rigid support member; and
- a layer of inert coating on the interior surface of the rigid support member in the first opening, the layer of inert coating covering the interior surface from the first surface to the second surface of the rigid support member, the layer of inert coating preventing fibers of the plurality of woven fibers from being exposed;

a fluid ejection die on the first surface of the rigid support member, the die including:
- a second opening aligned with the first opening through the rigid support member;
- a plurality of chambers coupled to the second opening;
- a plurality of nozzles, each of the plurality of nozzles being coupled to one chamber of the plurality of chambers; and
- a plurality of heaters, each of the plurality of heaters being configured to heat one chamber of the plurality of chambers;

a filter coupled to the second surface of the rigid support member;
a first adhesive between the die and the rigid support member, the first adhesive overlapping a first portion of the layer of inert coating; and
a second adhesive between the rigid support member and the filter, the second adhesive overlapping a second portion of the layer of inert coating.

5. The electronic subsystem of claim 4 wherein the first portion of the layer of inert coating is on the first surface of the rigid support member, and the second portion of the layer of inert coating is on the second surface of the rigid support member.

6. The electronic subsystem of claim 4 wherein the filter is spaced from second portion of the layer of inert coating by the second adhesive.

7. An electronic subsystem, comprising:
a printed circuit board having a first surface, a second surface, a first end, and a second end, the printed circuit board having a plurality of woven insulating fibers between the first and the second surfaces, the printed circuit board including:
- a plurality of contact pads on the first surface and at the first end;
- a first opening through the printed circuit board that exposes an internal sidewall of the printed circuit board, the first opening being at the second end, the first opening having an oval shape;
- a liner layer made of a single material formed in the first opening and on the internal sidewall of the printed circuit board;
- a second opening adjacent to the second end, the second opening having a circular shape; and
- a third opening adjacent to the second end, the third opening having a circular shape, the first opening separating the second opening and the third opening; and a microfluidic die on the first surface of the printed circuit board, a portion of the liner layer extending past the second surface, a surface of the plurality of contact pads being in a first plane, a surface of the die being in a second plane that is substantially parallel to the first plane, the die having:
- an inlet path in fluid communication with the first opening of the printed circuit board;
- a plurality of chambers;
- a plurality of heaters, each of the plurality of heaters being configured to eject fluid from one chamber of the plurality of chambers; and
- a plurality of nozzles in fluid communication with the inlet path.

8. The electronic subsystem of claim 7 wherein the printed circuit board is positioned between the portion of the liner layer and the microfluidic die.

9. The electronic subsystem of claim 7, further comprising:
a filter on the second surface of the printed circuit board.

10. The electronic subsystem of claim 7 wherein the liner layer is made of a conductive material.

* * * * *